United States Patent
Chung et al.

(10) Patent No.: US 11,187,953 B2
(45) Date of Patent: Nov. 30, 2021

(54) LASER PROCESSING APPARATUS, SEMICONDUCTOR DEVICE MANUFACTURING METHOD, AND AMORPHOUS SILICON CRYSTALLIZATION METHOD

(71) Applicant: THE JAPAN STEEL WORKS, LTD., Tokyo (JP)

(72) Inventors: Suk-Hwan Chung, Kanagawa (JP); Masashi Machida, Kanagawa (JP)

(73) Assignee: THE JAPAN STEEL WORKS, LTD., Tokyo (JP)

(*) Notice: Subject to any disclaimer, the term of this patent is extended or adjusted under 35 U.S.C. 154(b) by 78 days.

(21) Appl. No.: 16/320,069

(22) PCT Filed: Jun. 22, 2017

(86) PCT No.: PCT/JP2017/023048
§ 371 (c)(1),
(2) Date: Jan. 23, 2019

(87) PCT Pub. No.: WO2018/020918
PCT Pub. Date: Feb. 1, 2018

(65) Prior Publication Data
US 2019/0271871 A1    Sep. 5, 2019

(30) Foreign Application Priority Data
Jul. 26, 2016   (JP) .............................. JP2016-145883

(51) Int. Cl.
| G02B 27/10 | (2006.01) |
| G02F 1/1368 | (2006.01) |
| H01L 21/20 | (2006.01) |
| H01L 21/268 | (2006.01) |
| H01L 29/786 | (2006.01) |
| B23K 26/00 | (2014.01) |
| H01L 29/66 | (2006.01) |

(52) U.S. Cl.
CPC ............ G02F 1/1368 (2013.01); B23K 26/00 (2013.01); H01L 21/20 (2013.01);
(Continued)

(58) Field of Classification Search
CPC ... G02F 1/1368; H01L 21/20; H01L 21/2003; H01L 21/268; H01L 29/786;
(Continued)

(56) References Cited

U.S. PATENT DOCUMENTS 10,890,484 B2 *  1/2021  Moriya ................... H01S 3/139
2009/0246939 A1 * 10/2009  Azuma ............. H01L 21/02686
                                                              438/474

FOREIGN PATENT DOCUMENTS

| CN | 104704610 A | 6/2015 |
| JP | 2002176006 A | 6/2002 |

(Continued)

OTHER PUBLICATIONS

International Search Report (ISR) dated Sep. 19, 2017 issued in International Application No. PCT/JP2017/023048.
(Continued)

*Primary Examiner* — Mustak Choudhury
(74) *Attorney, Agent, or Firm* — Holtz, Holtz & Volek PC

(57) ABSTRACT

A laser processing apparatus includes: a laser light source that generates a laser beam; a first beam splitter on which the laser beam is incident; a second beam splitter on which the laser beam having passed through the first beam splitter is incident; and a homogenizer that controls an energy density of the laser beam emitted from the second beam splitter. The laser beam output from the homogenizer includes a p-polarized component and an s-polarized component, and a ratio of energy intensity of the p-polarized component to the s-polarized component is preferably not lower than 0.74 and not higher than 1.23 on a surface of the workpiece.

18 Claims, 13 Drawing Sheets

(52) U.S. Cl.
CPC ........ *H01L 21/2003* (2013.01); *H01L 21/268* (2013.01); *H01L 29/786* (2013.01); *H01L 29/66757* (2013.01)

(58) Field of Classification Search
CPC ......... H01L 29/66757; H01L 21/02488; H01L 21/02422; H01L 21/02532; H01L 21/02675; H01L 21/67011; H01L 21/02686; H01L 21/0262; H01L 27/3262; B23K 2103/54; B23K 2103/42; B23K 26/00; B23K 26/0608; B23K 26/0676; B23K 2101/40
See application file for complete search history.

(56) References Cited

FOREIGN PATENT DOCUMENTS

| | | | |
|---|---|---|---|
| JP | 2006156676 A | | 6/2006 |
| JP | 2007027289 A | * | 2/2007 |
| JP | 2007027289 A | | 2/2007 |
| JP | 2007335654 A | * | 12/2007 |
| JP | 2007335654 A | | 12/2007 |
| JP | 2009260268 A | | 11/2009 |
| JP | 2012023171 A | * | 2/2012 |
| JP | 2012023171 A | | 2/2012 |
| JP | 2014075562 A | | 4/2014 |
| KR | 20150060743 A | | 6/2015 |
| TW | 201421548 A | | 6/2014 |
| WO | 2014054687 A1 | | 4/2014 |

OTHER PUBLICATIONS

Written Opinion dated Sep. 19, 2017 issued in International Application No. PCT/JP2017/023048.

English language translation of Written Opinion dated Feb. 7, 2019 issued in International Application No. PCT/JP2017/023048.

* cited by examiner

FIG.13
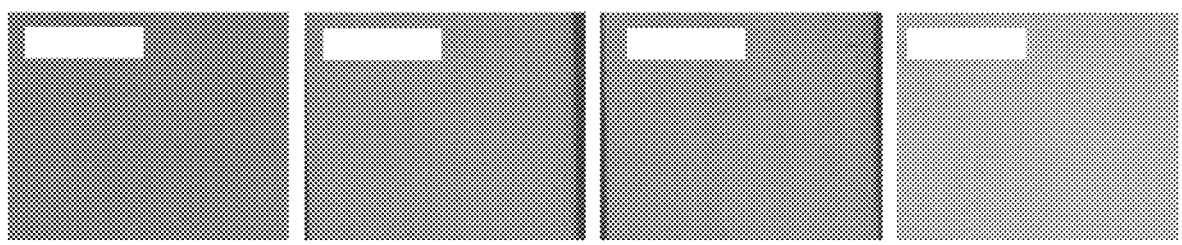
Scan direction
Substitution photographs for drawing

LASER PROCESSING APPARATUS, SEMICONDUCTOR DEVICE MANUFACTURING METHOD, AND AMORPHOUS SILICON CRYSTALLIZATION METHOD

TECHNICAL FIELD

The invention relates to a technique of processing a workpiece by emitting a laser beam on the workpiece.

BACKGROUND ART

In a liquid crystal display, an organic electroluminescence (EL) display, or the like, a thin film transistor (TFT) in which a crystalline silicon film serves as a channel region for switching of pixels is used. As a method of manufacturing the crystalline film, a laser annealing method is known in which a thermal treatment is performed by irradiating amorphous silicon with a laser beam. Since crystalline silicon has higher electron mobility than amorphous silicon, the speed of a switching operation of the TFT increases.

In conventional laser annealing treatments, crystallization of a silicon thin film by a laser annealing apparatus has been improved by reducing unevenness in laser energy, or improving uniformity in the strength of a line beam, for example.

The size of a semiconductor film, particularly a mother glass on which the silicon film is placed, is increased over the years to reduce cost, and in laser annealing, the silicon film is crystallized by irradiating the whole surface of the glass. Accordingly, as the size of the glass increases, the production amount reduces. As a countermeasure, in a laser annealing apparatus, the line beam is extended and the number of scanning with the line beam is reduced to improve productivity. As the length of the line beam increases, the required laser energy also increases, and a high output laser is required. However, it is undesirable to make the energy of the laser beam uneven by increasing the output of laser performance. Hence, a method has been proposed to use multiple lasers with less unevenness in laser energy, synchronize the beams output from the lasers, and combine the beams to obtain the required laser energy.

Additionally, although a homogenizer is used to homogenize a laser beam, an output source of the laser light is located away from the homogenizer, and the irradiation result is affected by the difference among characteristics of the combined laser beams. This leads to a problem of unevenness after the irradiation.

Patent Literature 1 proposes a laser processing apparatus that can easily control pulse shapes of laser beams and improve stability of laser output. Specifically, laser beams L11 to L22 are emitted by appropriate time differences and planes of polarization from multiple solid laser apparatuses, and then the laser beams L11 to L22 are combined by a combining optical system, divided into secondary light sources by a homogenizer, and are superimposed and incident onto a processing plane.

CITATION LIST

Patent Literature

[Patent Literature 1] Japanese Patent Laid-Open No. 2002-176006

SUMMARY OF INVENTION

Technical Problem

However, it has been found that at the time of irradiation with a laser beam, not only unevenness in energy, but also the state of polarization of a laser beam causes a significant difference in the resultant silicon thin film after the treatment.

In the conventional technique, a line beam is formed by simply combining three-dimensional beams with respect to multiple laser beams. However, an optimal polarization component cannot be obtained, and the state largely affects the crystalline silicon.

As a result of intensive studies, the present inventors have found that crystallization of a silicon thin film can be improved by controlling polarization of a laser beam irradiated on the silicon thin film, and have completed the present invention.

The present invention has been made in view of the foregoing, and an objective of the invention is to provide a laser processing apparatus, a semiconductor device manufacturing method, and an amorphous silicon crystallization method that achieves an appropriate state of polarization of a laser beam irradiated on a workpiece, and allows the workpiece to be processed favorably.

Solution to Problem

In an embodiment of the present application, disclosed is a laser processing apparatus including: a laser light source that generates a laser beam; a first beam splitter on which the laser beam is incident; a second beam splitter on which the laser beam having passed through the first beam splitter is incident; and a homogenizer that controls an energy density of the laser beam emitted from the second beam splitter.

Other objectives and novel characteristics shall be apparent from the description of the specification and the accompanying drawings.

Advantageous Effects of Invention

According to the embodiment, when a laser beam is irradiated on a workpiece after passing through at least a first beam splitter and a second beam splitter, energy is homogenized and an appropriate state of polarization of the laser beam can be achieved on the workpiece, whereby excellent processing can be performed.

BRIEF DESCRIPTION OF DRAWINGS

FIG. 13 is a diagram showing a microphotograph of the surface of a crystallized substrate after changing the polarization ratio in the example.

DESCRIPTION OF EMBODIMENTS

Figure 1:
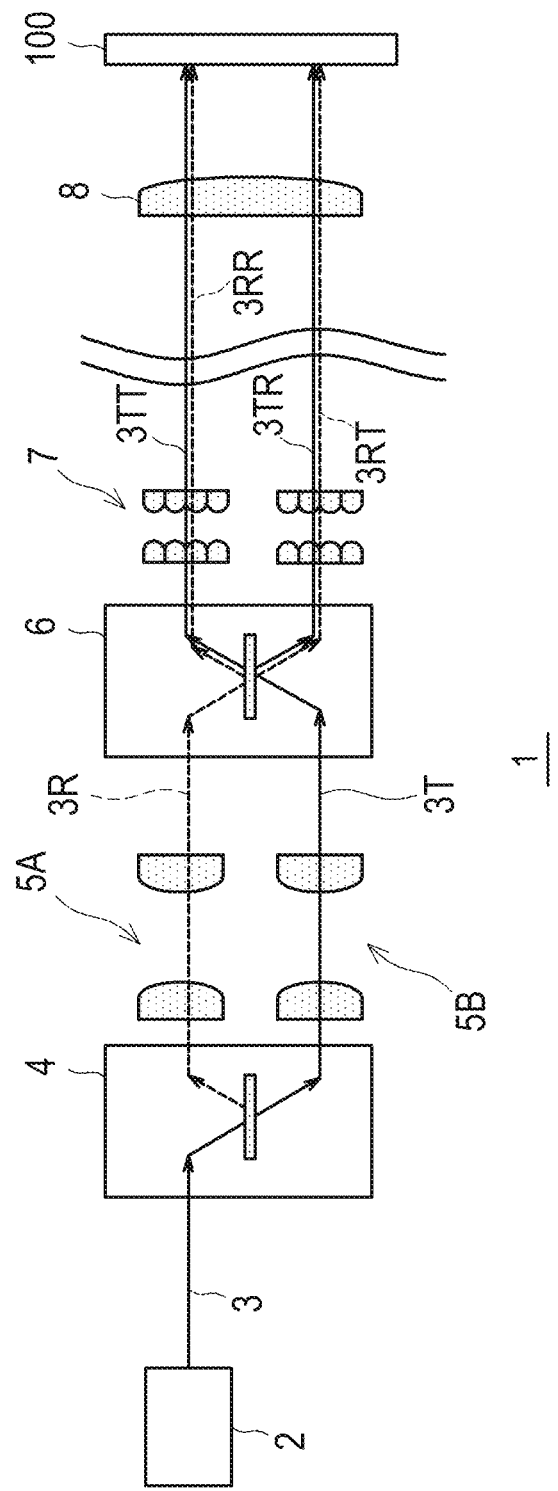
FIG. 1 is a diagram showing a schematic configuration of a laser processing apparatus of an embodiment of the present invention.

In the present application, the description of embodiments are sometimes divided into multiple sections for convenience. However, unless clearly stated otherwise, these are not individual descriptions, and are parts of a single example, one is a partial detailed description of the other, or one is a partial or entire modification of the other, for example. Additionally, the same parts are basically omitted. Moreover, components of the embodiments are not essential unless clearly stated otherwise, theoretically limited to the number, or apparent from the description.

Embodiment 1

<<Configuration of Laser Processing Apparatus>>

Hereinafter, a laser processing apparatus 1 of an embodiment will be described with reference to the accompanying drawings.

The laser processing apparatus 1 has a laser light source 2 that outputs a laser beam, and a first beam splitter 4 is placed on an optical path thereof, so that two optical paths are obtained on its exit side. A collimator 5A which is an optical lens group is placed on one optical path, and a collimator 5B which is an optical lens group is placed on the other optical path. The collimators 5A and 5B shape the incident laser beams into parallel light beam, and emit the rays.

A second beam splitter 6 is placed on the exit side of the collimators 5A and 5B, and a homogenizer 7 is placed on the exit side of the second beam splitter 6.

A condenser lens 8 is placed on the exit side of the homogenizer 7, and the focal point of the condenser lens 8 is positioned in the vicinity of the surface of a workpiece. An appropriate optical member such as a mirror and a lens can be included in the optical path between the homogenizer 7 and the condenser lens 8. In the embodiment, the workpiece is a substrate 100 having an amorphous silicon film (not shown) formed on the surface thereof.

The substrate 100 is placed on an unillustrated stage, for example.

The type of oscillation of the laser light source 2 is not particularly limited, and can be selected appropriately from among gas laser, solid laser, and the like. An example of gas laser is excimer laser using gas such as chlorine.

Additionally, although the embodiment includes two optical paths on the exit side of the first beam splitter 4 and on the exit side of the second beam splitter 6 respectively, the two optical paths can be configured as a single shared optical path.

Note that although the first beam splitter 4 and the second beam splitter 6 are illustrated in a plate shape in the present embodiment, the parts can be formed into a cube shape, and the structure of the beam splitter is not particularly limited.

<<Operation of Laser Processing Apparatus>>

An operation of the laser processing apparatus 1 will be described.

A single laser beam 3 outputted from the laser light source 2 is incident on the first beam splitter 4, is partially transmitted and partially reflected to be split into two laser beams, and is emitted from the first beam splitter 4. In the first beam splitter 4, the state of polarization differs between the transmitted light and the reflected light of the laser beam. The laser beam that is reflected on a surface of the beam splitter has stronger s-polarized linear polarization than p-polarized linear polarization, and the laser beam that passes through the surface of the beam splitter has stronger p-polarized linear polarization than s-polarized linear polarization.

The change in the state of polarization in the first beam splitter 4 differs depending on the selection of the material such as an optical thin film used for the first beam splitter 4. For example, the ratio of transmitted light to reflected light changes and the ratio of p-polarized component to s-polarized component in the laser beam on the exit side changes according to the material of the optical thin film. In the first beam splitter 4, the material of the optical thin film only needs to be selected according to the desired change in state of polarization, and the present invention is not limited to a particular material.

According to the characteristic of the first beam splitter 4, the laser beam 3 incident on the first beam splitter 4 is partially reflected at a predetermined rate to be emitted as an s-polarized laser beam 3R, and partially transmitted at a predetermined rate to be emitted as a p-polarized laser beam 3T.

The laser beam 3R emitted after being reflected by the first beam splitter 4 is shaped into parallel light beam in the collimator 5A, and the laser beam 3T emitted after passing through the first beam splitter 4 is shaped into parallel light beam in the collimator 5B. The laser beams 3R and 3T having passed through the collimators 5A and 5B are incident on the second beam splitter 6.

In the second beam splitter 6, the laser beam 3R is incident on the upper side of figure of the second beam splitter 6, while the laser beam 3T is incident on the lower side of figure of the second beam splitter 6. The laser beams are both partially transmitted and are partially reflected to be split into four laser beams, and are emitted from the second beam splitter 6.

In the second beam splitter 6, the state of polarization changes depending on the transmission and reflection of the laser beam.

The change in the state of polarization in the second beam splitter 6 differs depending on the selection of the material such as an optical thin film used for the second beam splitter 6. For example, the ratio of transmitted light to reflected light changes, and the ratio of p-polarized component to s-polarized component in the laser beam on the exit side changes according to the material of the optical thin film. In the second beam splitter 6, the material of the optical thin film only needs to be selected according to the desired change in state of polarization, and the present invention is not limited to a particular material. Hence, the second beam splitter 6 is a polarizing beam splitter.

Note that the first beam splitter 4 and the second beam splitter 6 can be configured of the same type of beam splitter, or be configured of different types of beam splitters, and therefore can be configured to adjust the state of polarization differently.

Additionally, although the beam splitter reflects and transmits a laser beam in the above embodiment, the beam splitter can be configured to only transmit a laser beam on both sides, or be configured to only reflect a laser beam on both sides.

In the embodiment, according to the characteristic of the second beam splitter 6, the laser beams 3R and 3T incident on the second beam splitter 6 are partially reflected at a predetermined rate and partially transmitted at a predetermined rate to be respectively emitted. That is, a part of the laser beam 3R is reflected at a predetermined rate to form a laser beam 3RR, and a part of the laser beam 3R is transmitted at a predetermined rate to form a laser beam 3RT. Meanwhile, a part of the laser beam 3T is reflected at a predetermined rate to form a laser beam 3TR, and a part of the laser beam 3T is transmitted at a predetermined rate to form a laser beam 3TT.

From the second beam splitter 6, the laser beam 3RR and the laser beam 3TT are emitted in such a manner that travel along the same optical path, while the laser beam 3TR and the laser beam 3RT are emitted in such a manner that travel along the same optical path. These laser beams travel along the optical paths, pass through an unillustrated optical member provided according to need, and are incident on the condenser lens 8. At this time, the sectional shape of the beam is appropriately shaped. Although conceivable sectional shapes of the beam include a spot shape such as a circular section or square section, and a line shape, in the present invention, the sectional shape of the beam is not particularly limited. In the embodiment, the laser beam is shaped so as to have a line-shaped sectional shape.

The laser beam having passed through the condenser lens 8 is irradiated on the amorphous silicon film on the substrate 100. Crystallization processing is performed on the entire surface of the substrate 100, by relatively scanning the laser beam by moving the unillustrated stage or the laser beam in the direction of the minor axis of the line-shaped laser beam.

Note that the laser beams can be irradiated on the amorphous silicon film simultaneously or at different timings, or can be irradiated alternately or a single laser beam can be irradiated sequentially. In the irradiated area, the amorphous silicon is favorably crystallized by irradiation with each of laser beams having a controlled state of polarization. Since the laser beam and the substrate 100 are scanned relative to each other, crystallization processing by irradiation with the laser beam is performed on the irradiation surface of the substrate 100. Relative scanning can be performed by moving one or both of the irradiation point of the laser beam and the substrate.

In the embodiment, since the first beam splitter is provided near the laser light source and the second beam splitter is provided on the upstream side of the homogenizer, each of the laser beams pass through the same optical system (telescope lens), so that characteristics of each of the laser beams can be equalized.

Note that preferably, the same area on the irradiation surface is irradiated with a predetermined ratio of energy density between the p-polarized component and the s-polarized component, and the polarization ratio (p-polarization/s-polarization) is preferably not lower than 0.69 and not higher than 1.31. By configuring the amounts of p-polarized component and the s-polarized component in the laser beam arriving at the substrate 100 to be substantially equal, the crystals can be formed more homogeneously, even sized in a certain direction is equalized, and aligned uniformly. In practice, a desired result can be obtained when p-polarized component/s-polarized component is within the range of 0.74 to 1.23 inclusive.

In the example, p-polarization and s-polarization are based on the substrate 100, and p-polarization refers to linear polarization in a direction parallel to the plane of incidence on the substrate, while s-polarization refers to linear polarization in a direction perpendicular to the plane of incidence. Note that the oscillating direction of the electric field of the laser beam is defined as the polarization direction.

In each of the aforementioned first beam splitter 4 and second beam splitter 6, the state of polarization is set in such a manner that achieve the above state of polarization on the irradiation surface of the substrate 100.

Moreover, since the first beam splitter and the second beam splitter are configured, the beams reflected from the beam splitters are combined in the state of the right and left inverting from the original beam, whereby symmetry of the beam is improved. As a result, homogeneity of the energy of the line beam is improved.

As has been described, even when a single laser beam is used, the method of splitting and recombination of the laser beam can be used to improve unevenness in crystallization after irradiation. After splitting the beam, the polarization component of one of laser beams is changed, to configure in such a manner that reduce the difference between the amount of p-polarized component and the s-polarized component in the polarization component of the laser beam for irradiating the workpiece after a line beam is formed, thus, more homogeneous crystals can be obtained.

In particular, even at an optimal energy density, a more even polycrystalline can be obtained by controlling the polarization. In addition, a more even polycrystalline silicon film can be processed within a wider range of energy density.

Embodiment 2

Although two beam splitters are included in the above description of Embodiment 1, the number of beam splitters on the optical path can be increased to three or more.

Figure 2:
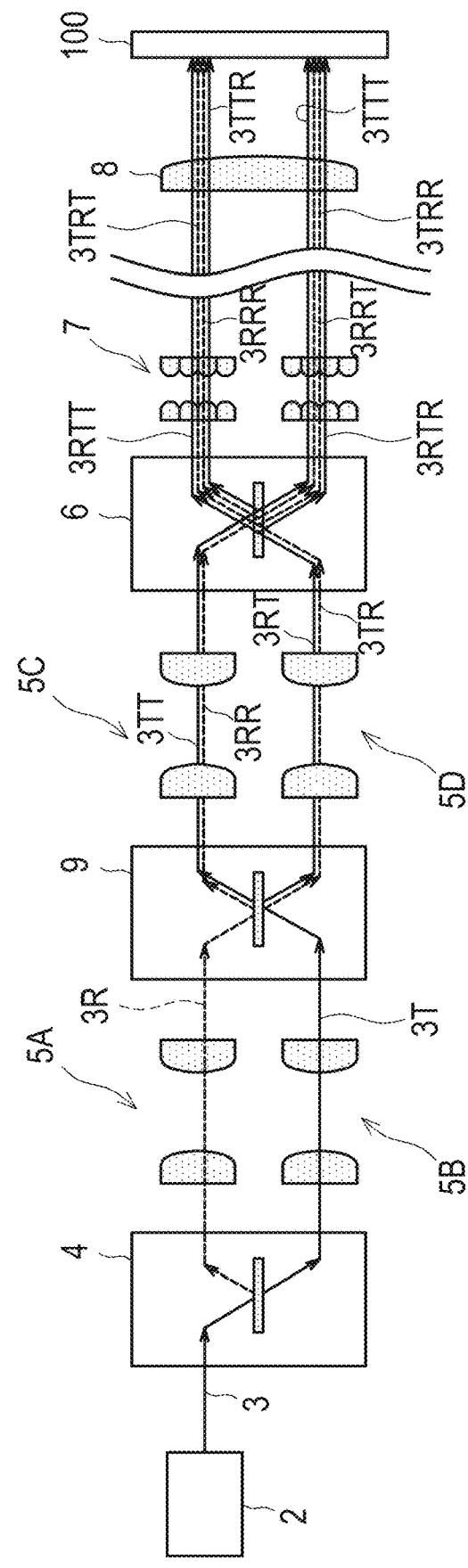
FIG. 2 is a diagram showing a schematic configuration of a laser processing apparatus of another embodiment.

FIG. 2 is an embodiment in which three beam splitters are placed along the beam traveling direction, and a third beam splitter 9 is placed on an optical path between a first beam splitter 4 and a second beam splitter 6 of Embodiment 1. Note that the same configurations as Embodiment 1 are assigned with the same reference numerals, and descriptions thereof will be omitted or simplified.

Collimators 5A and 5B are placed on an optical path between the first beam splitter 4 and the third beam splitter 9, and collimators 5C and 5D are placed between the third beam splitter 9 and the second beam splitter 6.

In the embodiment, according to the characteristic of the first beam splitter 4, as for a laser beam 3 incident on the first beam splitter 4, a laser beam 3R emitted after being reflected by the first beam splitter 4 is shaped into parallel light beam in the collimator 5A, while a laser beam 3T emitted after being reflected by the first beam splitter 4 is shaped into parallel light beam in the collimator 5B. The laser beams 3R and 3T having passed through the collimators 5A and 5B are incident on the third beam splitter 9.

In the third beam splitter 9, the state of polarization changes depending on the transmission and reflection of the laser beam. The laser beam reflected on the upper side shown in Figure has stronger s-polarized linear polarization component, while the laser beam transmitted on the lower side shown in Figure has stronger p-polarized linear polarization component. The change in the state of polarization in the third beam splitter 9 differs depending on the selection of the material such as an optical thin film used for the third beam splitter 9. For example, the ratio of transmitted light to reflected light changes, and the ratio of p-polarized component to s-polarized component in the laser beam on the exit side changes according to the material of the optical thin film. In the third beam splitter 9, the material of the optical thin film only needs to be selected according to the desired change in state of polarization, and the present invention is not limited to a particular material. Hence, the third beam splitter 9 is a polarizing beam splitter.

Note that the first beam splitter 4 and the third beam splitter 9 can be configured of the same type of beam splitter, or can be configured of different types of beam splitters.

According to the characteristic of the third beam splitter 9, the laser beam 3R incident on the third beam splitter 9 is partially reflected at a predetermined rate to form a laser beam 3RR, and partially passes through at a predetermined rate to form a laser beam 3RT.

According to the characteristic of the third beam splitter 9, the laser beam 3T incident on the third beam splitter 9 is partially reflected at a predetermined rate to form a laser beam 3TR, and partially passes through at a predetermined rate to form a laser beam 3TT.

Additionally, in order to change the ratio of the p-polarized component to the s-polarized component based on the ratio of reflected light to transmitted light, an non-polarized beam splitter can be used.

From the third beam splitter 9, the laser beam 3RR and the laser beam 3TT are emitted in such a manner that travel along the same optical path, while the laser beam 3TR and the laser beam 3RT are emitted in such a manner that travel along the same optical path. These laser beams are incident on the second beam splitter 6.

According to the characteristic of the second beam splitter 6, each of the laser beams incident on the second beam splitter 6 are partially reflected at a predetermined rate and partially transmitted at a predetermined rate to be respectively emitted. The reflected light forms s-polarized light, and transmitted light forms p-polarized light.

That is, a part of the laser beam 3RR is reflected at a predetermined rate to form a laser beam 3RRR, and a part of the laser beam 3RR is transmitted at a predetermined rate to form a laser beam 3RRT.

A part of the laser beam 3TT is reflected at a predetermined rate to form a laser beam 3TTR, and a part of the laser beam 3TT is transmitted at a predetermined rate to form a laser beam 3TTT.

Meanwhile, a part of the laser beam 3TR is reflected at a predetermined rate to form a laser beam 3TRR, and a part of the laser beam 3TR is transmitted at a predetermined rate to form a laser beam 3TRT. Moreover, a part of the laser beam 3RT is reflected at a predetermined rate to form a laser beam 3RTR, and a part of the laser beam 3RT is transmitted at a predetermined rate to form a laser beam 3RTT.

Additionally, when it is desired to change the ratio of the p-polarized component to the s-polarized component based on the ratio of reflected light to transmitted light, an non-polarized beam splitter can be used.

The laser beams 3RTT, 3RRR, 3TRT, and 3TTR emitted from the second beam splitter 6 travel along the same optical path, while the laser beams 3RTR, 3RRT, 3TTR, and 3TTT emitted from the second beam splitter 6 travel along the same optical path and pass through an unillustrated optical member provided according to need to incident on a condenser lens 8.

The laser beam having passed through the condenser lens 8 is irradiated on an amorphous silicon film on a substrate 100. Note that each of the laser beams are irradiated simultaneously or at different timings, or irradiated alternately, or a single laser beam is emitted sequentially.

By scanning the laser beam and the substrate 100 relative to each other, crystallization processing by irradiation with the laser beam is performed on a desired surface of the substrate 100.

The energy density of the p-polarized component and the s-polarized component is preferably not lower than 0.74 and not higher than 1.23 in the same area on the irradiation surface.

In each of the aforementioned first beam splitter 4, the third beam splitter 9, and the second beam splitter 6, the state of polarization is set in such a manner that achieve the above state of polarization on the irradiation surface of the substrate 100.

Embodiment 3

Note that although the state of polarization is controlled by the beam splitter alone in the above description of Embodiments 1 and 2, a polarization element can be added to the optical path to also control the state of polarization.

Figure 3:
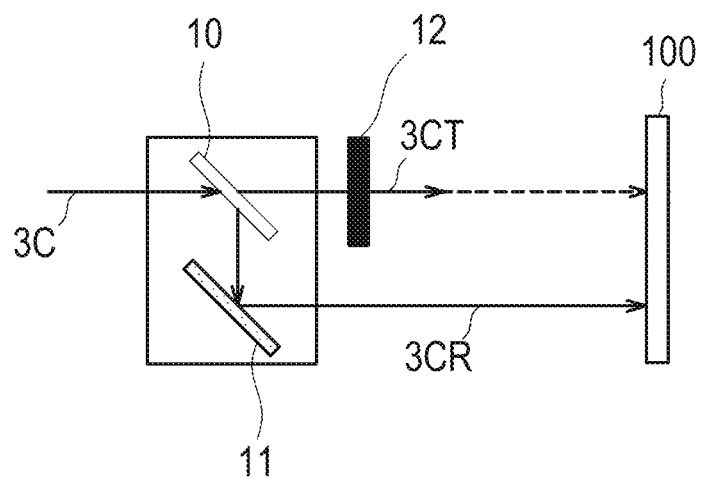
FIG. 3 is a diagram showing a schematic configuration of a laser processing apparatus of yet another embodiment.

FIG. 3 shows a partial configuration of the embodiment.

In the configuration, a beam splitter 10 and a mirror 11 opposite to the beam splitter 10 are provided, and a polarization element 12 is placed on the transmission side of the beam splitter 10.

A laser beam 3C incident on the beam splitter 10 is partially reflected at a predetermined rate to form a laser beam 3CR, and partially transmitted at a predetermined rate to form a laser beam 3CT.

The laser beam 3CT is transmitted through the beam splitter 10 to arrive at the polarization element 12, and the state of polarization changes when the laser beam 3CT is transmitted through the polarization element 12. The laser beam 3CR is reflected by the mirror 11 and travels along an optical path. The type of polarization element 12 is not particularly limited.

The laser beams 3CR and 3CT incident on a substrate 100 to crystallize amorphous silicon on a surface of the substrate 100. At this time, the energy density of the p-polarized component and the s-polarized component in the laser beam on the irradiation surface is set not lower than 0.74 and not higher than 1.23.

In the embodiment, the beam splitter 10 can be adopted as either the first beam splitter or the second beam splitter, or the polarization element can be placed on the laser beam traveling side of each of the first beam splitter and the second beam splitter.

That is, depending on the state of polarization and the like of the laser beam output from the laser light source, the state of polarization can be controlled by changing the polarization of only a part of laser beams among multiple laser beams.

Figure 4:
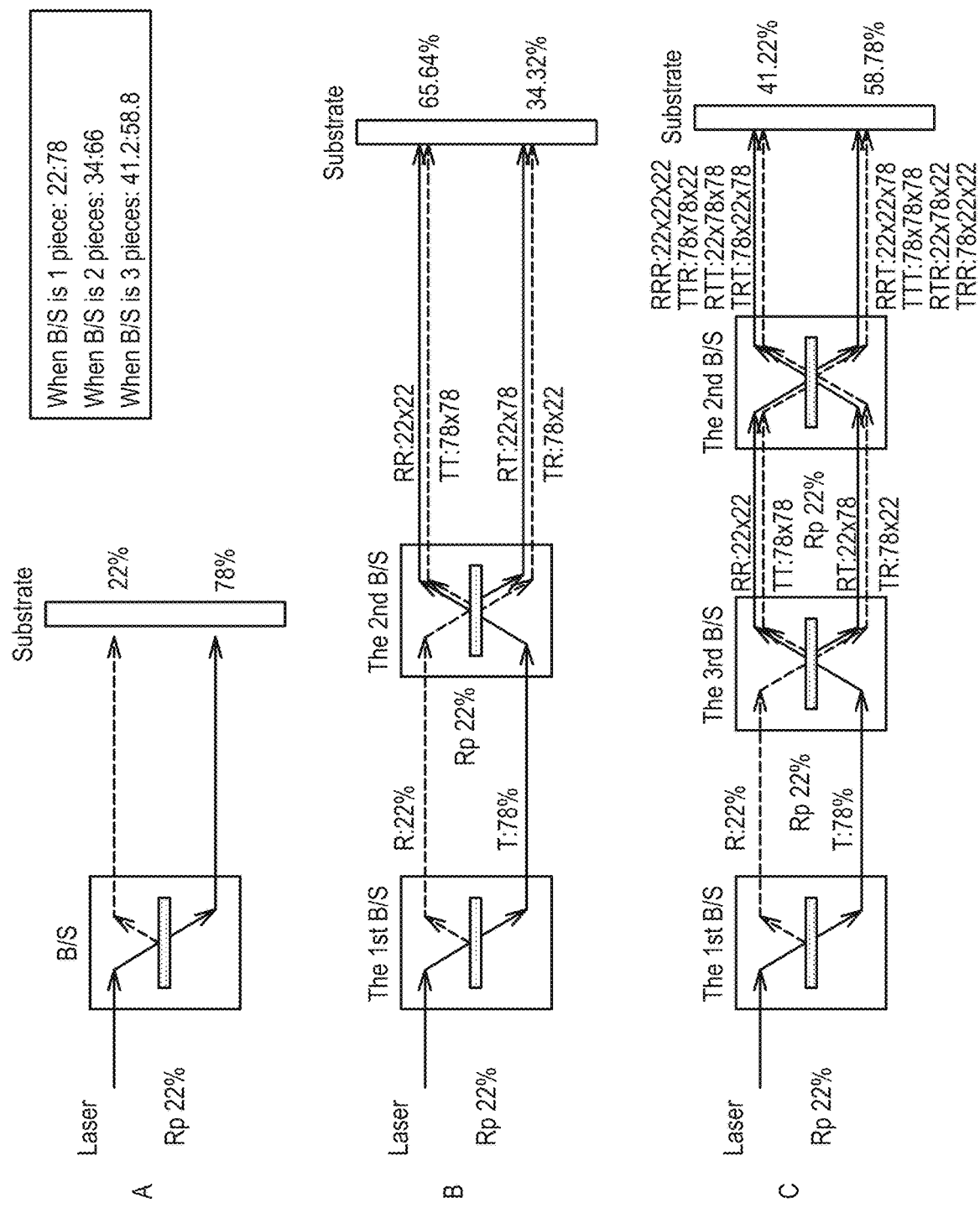
FIG. 4 is a diagram for describing changes in the state of polarization in a laser processing apparatus.

Next, an example of a change in state of polarization after passing through a beam splitter will be described with reference to FIG. 4.

Note that a beam splitter will hereinafter be referred to as B/S.

The same B/S is used in the examples, and the B/S emits an incident laser beam with random polarization by reflecting 50% of the energy density and transmitting 50% of the energy density. At this time, the s-polarized component is stronger in the laser beam reflected on the upper surface side of the beam splitter, and the p-polarized component is stronger in the laser beam transmitted through the lower surface side of the beam splitter. When the beam splitter splits a laser beam into equal energy densities (R 50%, T 50%), the polarization component is transmitted through at 78% P-polarization and 50% S-polarization, and reflected at 22% P-polarization and 50% S-polarization.

In the example of FIG. 4A, only one B/S is placed on the optical path.

That is, a single laser beam is incident on a single B/S, and 50% transmitted light and 50% reflected light are emitted and irradiated on a substrate. The B/S is characterized in that a laser beam reflected or transmitted on the upper surface side has p-polarized linear polarization, and a laser beam reflected or transmitted on the lower surface side has s-polarized linear polarization.

Consequently, the laser beam incident and reflected on the upper surface side of the B/S is emitted with 50% s-polarized component and 22% p-polarized component on the surface of the substrate, while the laser beam incident and transmitted on the upper surface side of the B/S is emitted with 50% s-polarized component and 78% p-polarized component on the surface of the substrate. Accordingly, the polarization ratio (p-polarized component/s-polarized component) of the respective laser beams are 22%/50%=0.44 and 78%/50%=1.56.

In the example of FIG. 4B, the laser beam is incident on the first B/S and then incident on the second B/S, the state of polarization is adjusted for each laser beam, and the laser beams are irradiated on the substrate.

In the first B/S, reflected light R forms 50% energy density, and transmitted light T forms 50% energy density.

In the second B/S, reflected light RR which is obtained by the reflected light R is reflected on the upper surface side has a p-polarized component of 22%×22%=4.84%, and transmitted light TT which is obtained by the transmitted light T transmits through on the upper surface side has a p-polarized component of 78%×78%=60.8%. Hence, the p-polarized component of the laser beam is a total of 65.64% on the surface of the substrate.

Meanwhile, reflected light TR which is obtained by the transmitted light T is reflected on the lower surface side has a p-polarized component of 78%×22%=17.16%, and transmitted light RT which is obtained by the reflected light R transmits through on the lower surface side has a p-polarized component of 22%×78%=17.16%. Hence, the p-polarized component of the laser beam is a total of 34.32% on the surface of the substrate.

In the example of FIG. 4C, the laser beam is incident on the first B/S and then incident on the third B/S, the state of polarization is adjusted for each laser beam, the laser beams are further incident on the second B/S, the state of polarization is adjusted for each laser beam, and then the laser beams are irradiated on the substrate.

In the lower row (C), the laser beam emitted from the third B/S can be regarded as the laser beams emitted from the second B/S in the middle row (B), and therefore these laser beams are incident on the second B/S.

An RR component incident on the second B/S forms reflected light RRR reflected on the upper surface side, and has a p-polarized component of 22%×22%×22%=1.06%.

Reflected light TTR which is obtained by a TT component is reflected on the upper surface side is 78%×78%×22%=13.38%, transmitted light RTT which is obtained by an RT component transmits through on the upper surface side is 22%×78%×78%=13.38%, and transmitted light TRT which is obtained by a TR component is transmitted through on the upper face side is 78%×22%×78%=13.38%. Hence, the p-polarized component of the laser beam is a total of 41.22% on the surface of the substrate.

Meanwhile, reflected light RTR which is obtained by the RT component is reflected on the lower surface side is 22%×22%×78%=3.775%, reflected light TRR which is obtained by the TR component is reflected on the lower surface side is 78%×22%×22%=3.775%, transmitted light which is obtained by the RR component is transmitted through on the lower surface side is 22%×22%×78%=3.775%, and transmitted light which is obtained by the TT component is transmitted through on the lower surface side is 78%×78%×78%=47.45%. Hence, the p-polarized component is a total of 58.78% on the surface of the substrate.

Accordingly, when two beam splitters are used, the polarization ratio (p-polarized component/s-polarized component) of each of the laser beams is 65.64%/50% and therefore approximately 1.31, and 34.32%/50%=approximately 0.68, respectively.

Moreover, in the example using three beam splitters, the polarization ratios (p-polarized component/s-polarized component) are 41.22%/50%=approximately 0.82, and 58.78%/50%=approximately 1.18 respectively.

The polarization ratio is within the range of 0.69 to 1.31. Even with more beam splitters, the polarization ratio falls within this range.

Embodiment 4

Note that although a single laser beam is split and used in the description of the above embodiments, multiple laser beams output from multiple laser light sources also can be used to perform laser processing.

Figure 5:
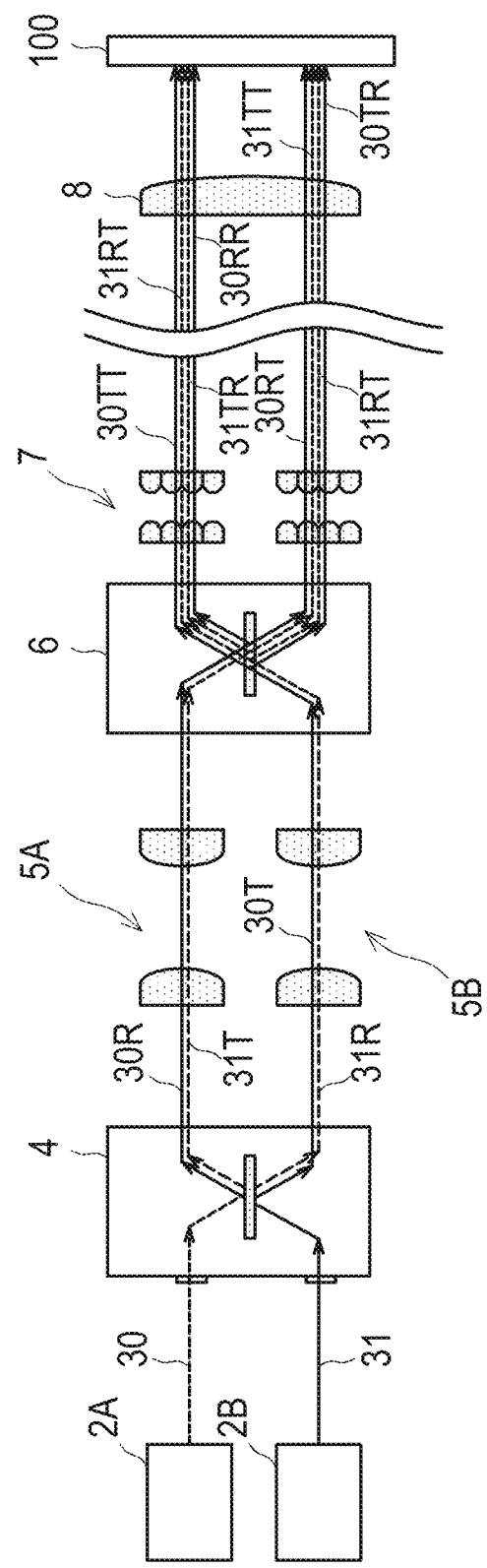
FIG. 5 is a diagram showing a schematic configuration of a laser processing apparatus of still yet another embodiment.

Hereinafter, Embodiment 4 using multiple laser light sources will be described with reference to FIG. 5. Note that the same configurations as the aforementioned embodiments are assigned with the same reference numerals, and descriptions thereof will be omitted or simplified.

In Embodiment 3, two laser light sources 2A and 2B respectively outputting laser beams 30 and 31 are provided. A first beam splitter 4 is placed on the downstream side of the laser light sources 2A and 2B. As in the case of the aforementioned embodiments, the type of oscillation of the laser light sources 2A and 2B is not particularly limited.

Collimators 5A and 5B are placed in the traveling direction of an optical path of the first beam splitter 4, and a second beam splitter 6 is placed in the optical path traveling direction side. A homogenizer 7 and a condenser lens 8 are placed on the optical path traveling direction side of the second beam splitter 6 to enable irradiation of a substrate 100 with laser beams.

The laser beams 30 and 31 output from the laser light sources 2A and 2B are concurrently incident on the first beam splitter 4. The laser beam 30 is partially reflected at a predetermined rate to form a reflected light 30R (s-polarized component), and the laser beam 30 is partially transmitted at a predetermined rate to form a transmitted light 30T (p-polarized component). Meanwhile, the laser beam 31 is partially reflected to form a reflected light 31R (s-polarized component), and the laser beam 31 is partially transmitted to form a transmitted light 31T (p-polarized component). The laser beams 30R, 30T, 31R, and 31T are shaped into parallel light beam in the collimators 5A and 5B, and are then incident on the second beam splitter 6. The laser beams 30R and 31T have p-polarized linear polarization, while the laser beams 30T and 31R have s-polarized linear polarization.

In the second beam splitter 6, the laser beam 30R is partially reflected on the upper surface side to form a laser beam 30RR, and is partially transmitted on the lower surface side to form a laser beam SORT. Meanwhile, the laser beam 30T is partially reflected on the lower surface side to form a laser beam 30TR, and is partially transmitted on the upper surface side to form a laser beam 30TT.

The laser beam 31R is partially reflected on the upper surface side to form a laser beam 31RR, and is partially transmitted on the lower surface side to form a laser beam 31RT. Meanwhile, the laser beam 31T is partially reflected on the lower surface side to form a laser beam 31TR, and is partially transmitted on the upper surface side to form a laser beam 31TT.

The laser beams 30RR, 30TT, 31RT, and 31TR travel along the same optical path on the upper surface side of the second beam splitter 6, while the laser beams 30RT, 30TR, 31RR, and 31TT travel along the same optical path on the lower surface side of the second beam splitter 6.

These laser beams are incident on the homogenizer 7 to homogenize the energy density, and then pass through the condenser lens 8, and are irradiated on an amorphous silicon film on a substrate 100 to achieve excellent crystallization.

In the embodiment, the substrate can be irradiated by use of laser beams simultaneously oscillated from multiple laser light sources. Note that the number of laser light sources is not limited, and the laser beams can be irradiated by providing three or more laser light sources.

Even in the case of simultaneous irradiation with multiple laser light sources, in the laser beam, the ratio of energy density of the p-polarized component to the s-polarized component on the irradiation surface of the substrate should be within the range of not lower than 0.74 and not higher than 1.23.

In laser annealing method using multiple lasers, by controlling the polarization component, more homogeneous crystals also can be formed as a result of crystallization of a silicon film, and excellent crystals also can be obtained in a wider range with respect to laser energy density.

Moreover, when multiple lasers having different characteristics are used, an influence of the difference among laser characteristics on a workpiece can be minimized by providing a beam splitter on the homogenizer side.

Embodiment 5

Figure 6:
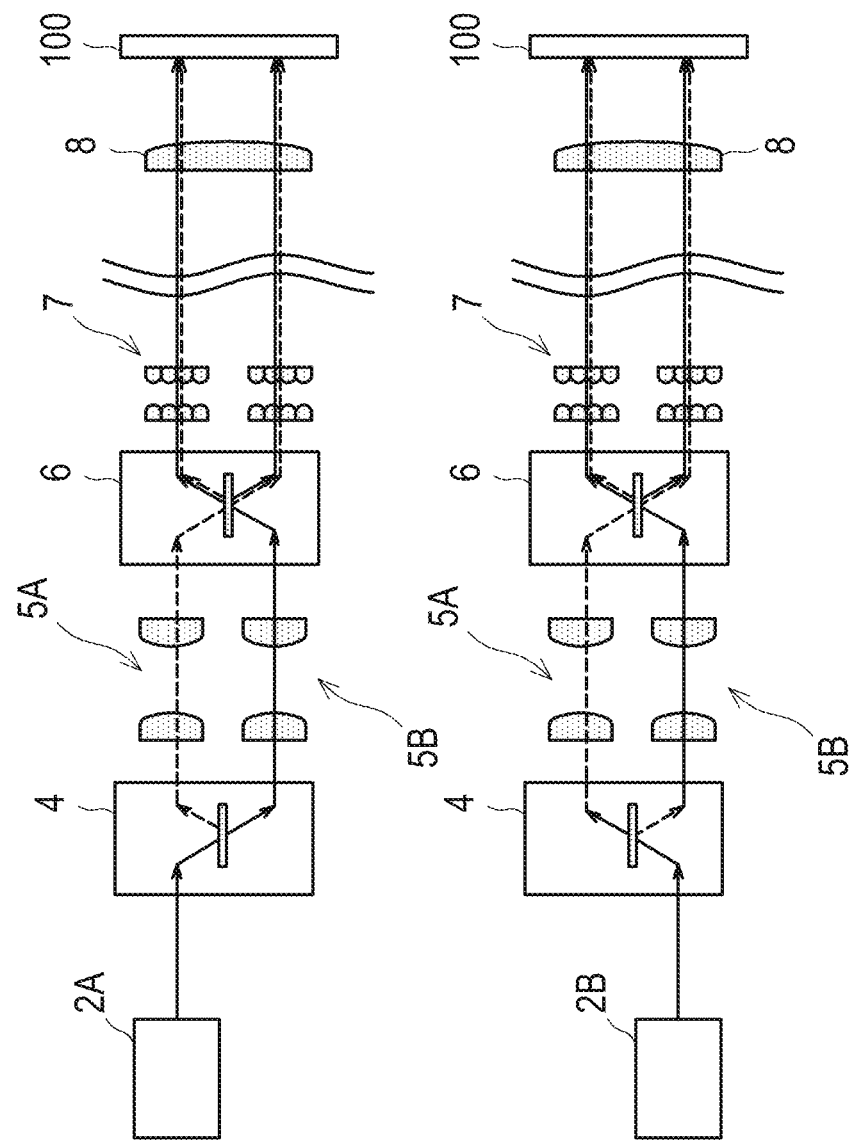
FIG. 6 is a diagram showing a schematic configuration of a laser processing apparatus of still yet another embodiment.

Although laser beams output from multiple laser light sources are irradiated concurrently in the description of the above embodiment, the laser beams also can be irradiated alternately. Hereinafter, Embodiment 5 of a laser processing apparatus enabling such irradiation will be described with reference to FIG. 6.

In the embodiment, laser light sources 2A and 2B which alternately perform oscillation are provided, and laser beams output from the respective output sources are irradiated on a substrate 100 through optical paths having the same configuration. The optical path includes a first beam splitter 4, collimators 5A and 5B, a second beam splitter 6, a homogenizer 7, and a condenser lens 8. In this embodiment, the state of polarization of a laser beam having passed through the first beam splitter 4 and the second beam splitter 6 is controlled as in the case of the aforementioned embodiments, and excellent crystallization also can be achieved on an irradiation surface of the substrate 100.

Note that although separate optical paths are illustrated in Figure for the sake of convenience, the embodiment utilizes the same optical members provided on the same optical path.

Additionally, although the laser beams output from the laser light sources 2A and 2B travel along the same optical path in the embodiment, the configuration of the present invention also can include some different optical paths and optical members to irradiate the substrate. Note, however, it is preferably that the laser beams pass through the optical systems as common as possible.

In particular, in laser annealing method where each of the lasers is irradiated alternately, each of the lasers is irradiated separately on the irradiation object. That is, since the laser beams do not intersect with each other, the laser beams have a large impact on the workpiece, and unevenness due to laser characteristics is clearly visible. By providing a beam combining section between the laser light source and a lens closest to the laser light source, and combining the lasers in such a manner that the laser characteristics are equalized, the irradiation result on the irradiation object can be improved without influenced by unevenness of the laser characteristics.

Embodiment 6

In the above embodiments, since excellent crystallization is achieved by irradiating the irradiation surface in an appropriate state of polarization, it is important to control the state of polarization.

Figure 7:
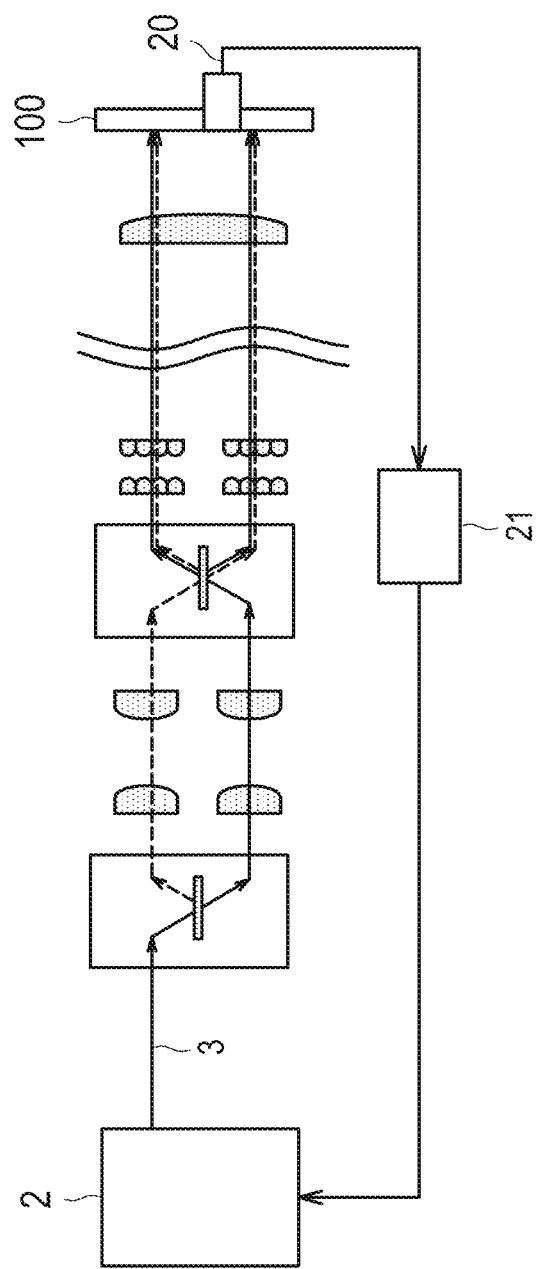
FIG. 7 is a diagram showing a schematic configuration of a laser processing apparatus of still yet another embodiment having a polarization measuring section.

In Embodiment 6, as shown in FIG. 7, a measurement section 20 that receives a part of a laser beam on an irradiation surface and measures the state of polarization is provided, and is incorporated in the apparatus of Embodiment 1.

The measurement section 20 can be configured to follow the relative movement of the laser beam in a case where the laser beam is moved relatively. For example, when the substrate side is moved at the time of the relative movement of the laser beam, the measurement section 20 is moved together with the substrate. The measurement section 20 can instead receive the laser beam temporarily without being moved, to measure the state of polarization.

The configuration of the measurement section 20 is not particularly limited, and can be configured by use of a polarization element, a wave plate, a rotating analyzer, other polarization elements, and a light-intensity detector, and a known configuration can be used. The polarization characteristic can be obtained by detecting as the light intensity.

Note that although the state of polarization is measured by receiving the laser beam on the irradiation surface by the measurement section 20 in the embodiment, the installation position of the measurement section 20 is not particularly limited, as long as it is on the optical path. For example, even if a laser beam is received before the final state of polarization is established, the state of polarization in the measurement position can be controlled in such a manner of predicting subsequent changes and forming a predetermined state of polarization on the irradiation surface.

The measurement result of the measurement section 20 is connected to a monitor-equipped controller 21. The monitor-equipped controller 21 can be configured by a CPU, a program operating on the CPU, and operation setting parameters, for example. The monitor-equipped controller 21 gives output to a laser light source 2, and performs feedback control of the state of polarization of the laser light source. In the monitor-equipped controller 21, the laser light source 2 is controlled on the basis of the measurement result of the measurement section 20. In the controller 21, the state of polarization on the irradiation surface and settings of the laser light source 2 are associated in advance, and the state of polarization of the laser light source 2 is controlled on the basis of changes in the state of polarization. The monitor-equipped controller 21 can be provided as an auxiliary part of the laser processing apparatus, or can be connected to the laser processing apparatus through a control line or a network.

In the laser light source 2, the state of polarization can be controlled by adjusting a laser optical system, a laser voltage, a mixture ratio of laser gas, and the like.

Moreover, the measurement result can be displayed on a monitor of the monitor-equipped controller 21. Further, instead of providing the controller, the measurement result can be displayed on a monitor or the like, and the laser light source can be adjusted by manual scanning based on the result.

Figure 8:
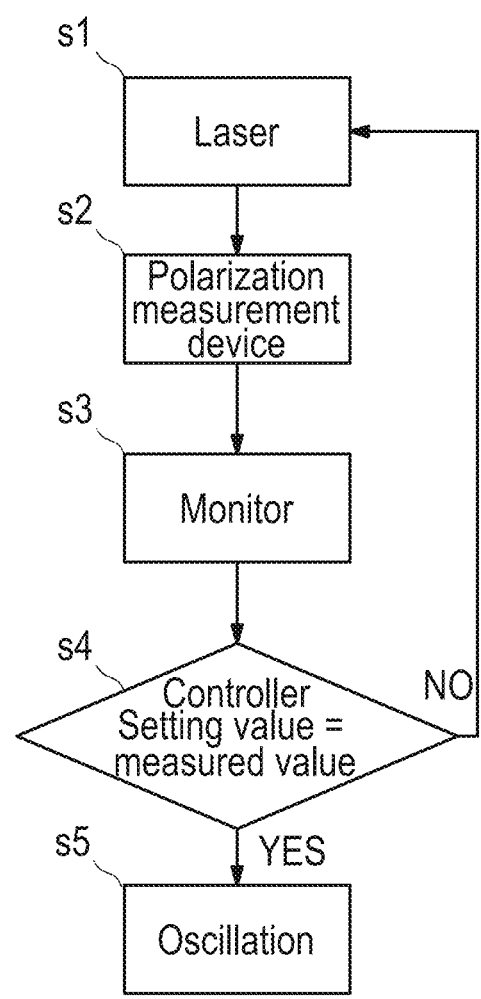
FIG. 8 is a flowchart showing an example of a procedure of controlling the state of polarization.

FIG. 8 is a flowchart showing a procedure of controlling the state of polarization in the laser processing apparatus shown in FIG. 7. The control procedure is carried out by the controller shown in FIG. 7.

In the laser light source, a laser beam is output by a predetermined setting parameter (step s1). The state of polarization of the laser beam is measured by a measurement device (step s2), the measurement result is displayed on a monitor (step s3), furthermore, the controller determines whether the measured value is within the range of a setting value (step s4), if it is within the range (YES in step s4), the laser beam is oscillated and the substrate is processed (step s5).

On the other hand, if the measured value obtained by the measurement differs from the setting value (NO in step s4), in step s1, a laser output section is controlled such that a desired measurement state can be obtained (step s1). Then, the above procedure is repeated to perform control such that the substrate is irradiated with a laser beam in a desired state of polarization.

In the embodiment, the state of polarization is controlled before irradiation with laser, and when a desired state of polarization is obtained, the laser irradiation is performed. Instead, the state of polarization can be controlled dynamically by taking out a part of the laser beam during laser irradiation.

Note that although the laser processing apparatus is used to crystallize an amorphous silicon film in the description of the aforementioned embodiments, the invention is not limited to this, and is applicable to crystallization of GaN, crystallization of oxides, for example.

Embodiment 7

A semiconductor film manufactured by Embodiment 1 can be used for a semiconductor element such as a thin film transistor (TFT).

Figure 9:
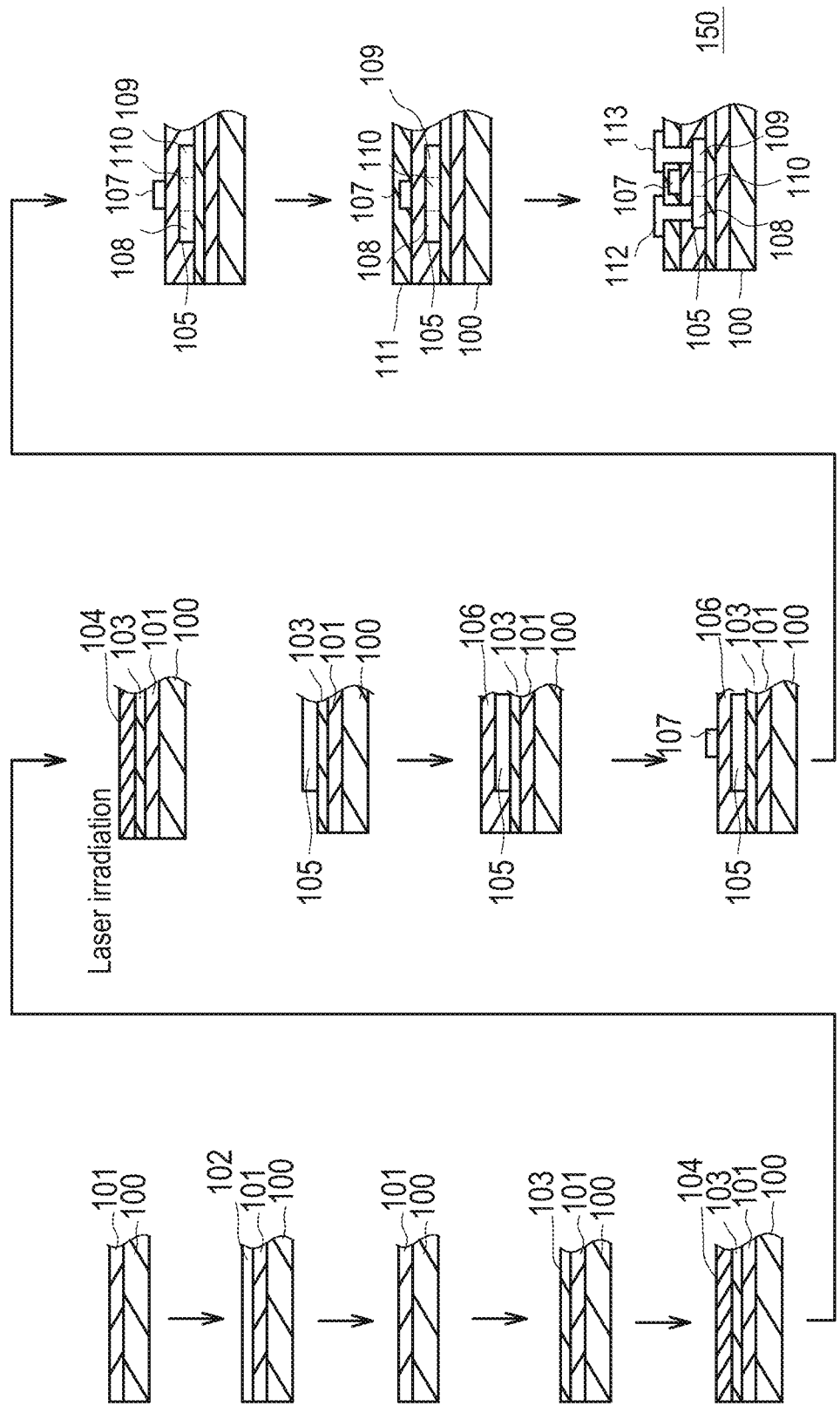
FIG. 9 is a flowchart showing a manufacturing process of a semiconductor element of an embodiment of the present invention.

Hereinafter, a manufacturing method of a thin film transistor 150 will be described as an example, with reference to a flowchart of FIG. 9.

A basecoat film 101 is formed on an upper layer of a substrate 100. As the material of the substrate 100, appropriate materials such as glass and plastic (acrylic resin) are usable. Examples of the base coat film 101 include silicon oxide and silicon nitride and the like.

A conductive film 102 is formed on an upper layer of the basecoat film 101, and is etched into a predetermined pattern.

A base insulating film 103 is formed on an upper layer of the conductive film 102, and an amorphous silicon film 104 is formed on an upper layer of the base insulating film 103.

A laser beam is irradiated on the amorphous silicon film 104 in a laser beam irradiation step.

In the laser beam irradiation step, the amorphous silicon film is formed into a polycrystalline silicon film 105. Then, the polycrystalline silicon film 105 is patterned into a predetermined shape.

Next, a gate insulation film 106 is formed on the polycrystalline silicon film 105, and a gate electrode 107 is formed on the gate insulation film 106.

The polycrystalline silicon film 105 includes a source region 108 into which impurities such as phosphorus and boron are doped on one end side, a drain region 109 into which impurities are doped on the other end side, and a channel region 110 in a middle part.

An interlayer insulation film 111 is provided on the gate insulation film 106. Then, a source electrode 112 connected to the source region 108 and a drain electrode 113 connected to the drain region 109 are formed.

In the aforementioned laser beam emission step, multiple laser beams having states of polarization in intersecting directions are irradiated with delay as described in the embodiment 1. Hence, an excellent polycrystalline silicon film 105 with substantially homogeneous crystal particle sizes and having sufficient electron mobility can be obtained. Since the polycrystalline silicon film 105 forms the source region, the drain region, and the channel region of the thin film transistor 150, switching speed of the thin film transistor 150 can be improved.

Embodiment 8

Figure 10:
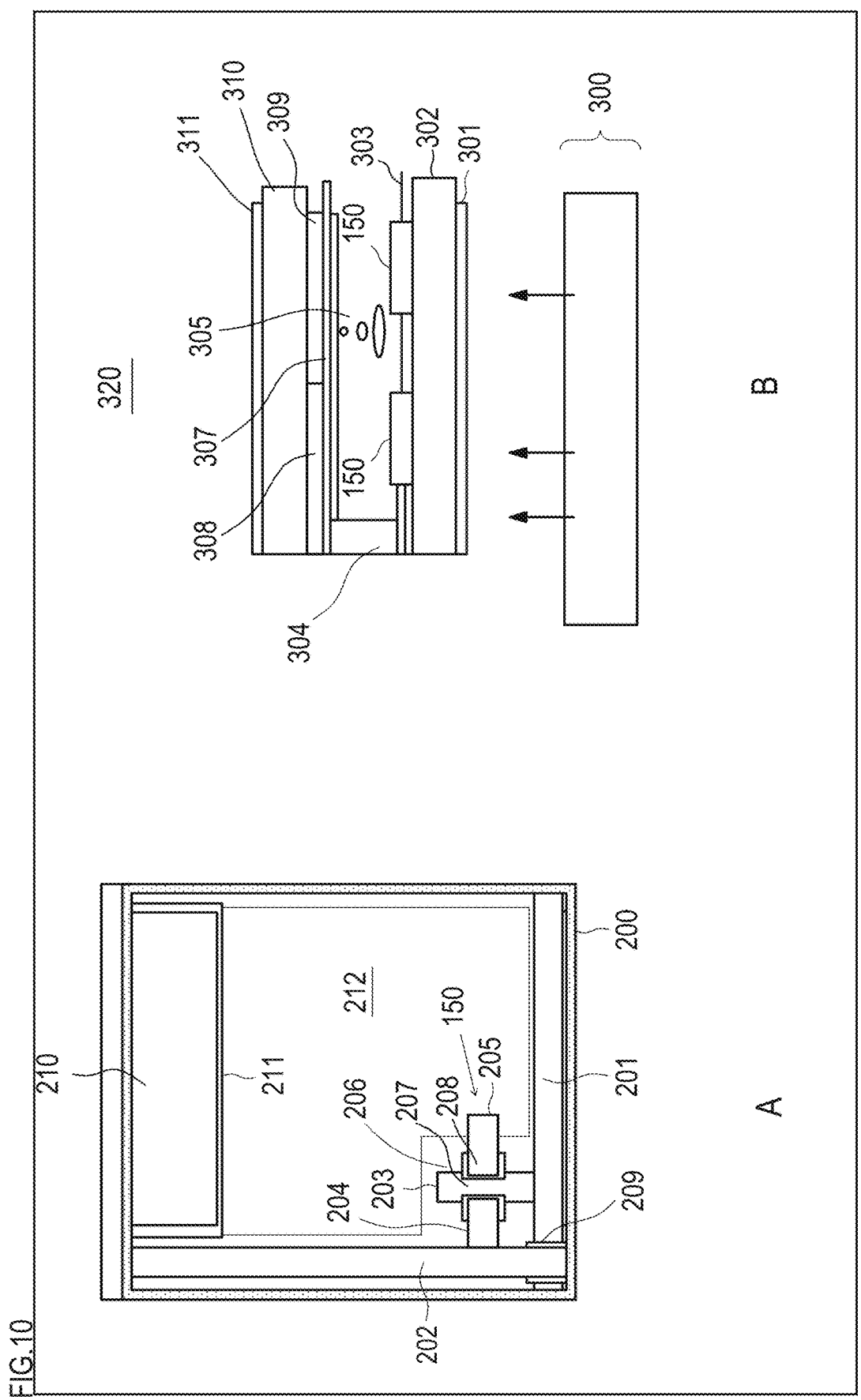
FIG. 10 relates to a display of an embodiment of the present invention, wherein Figure A is a diagram showing a pixel of a display of the present invention, and Figure B is a diagram showing a schematic section of a part of a structure of the display.

Next, as a usage example of the thin film transistor 150 of Embodiment 7, a thin film transistor-liquid crystal display (TFT-LCD) will be described with reference to FIG. 10.

FIG. 10A shows a schematic configuration of a subcell 200 arranged in a grid-like manner on a display, and shows an additional capacity type. The thin film transistor 150 is used to drive and control the pixel. Note that the driving method is not particularly limited, and an appropriate method can be selected from among frame inversion, division driving, and other methods.

In the subcell 200, a gate electrode line 201 and a source electrode line 202 arranged in a matrix shape are provided on the display, and an insulating film 209 is provided therebetween. A source electrode 204 and a gate electrode 203 of the thin film transistor 150 are electrically connected to the above electrode lines.

Reference numeral 205 denotes a drain electrode, and an insulating film 206 is provided among the source electrode 204, the drain electrode 205, and the gate electrode 203.

Reference numeral 212 denotes a display electrode, and Reference numeral 210 denotes a storage electrode surrounded by an insulating film 211. Wiring to the storage electrode 210 is also served as the adjacent gate electrode line to simplify the manufacturing step.

Next, a cross-sectional view of the subcell is shown in FIG. 10B.

A substrate 302 is placed on a backlight module 300 through a polarizing plate 301, and on the substrate 302, a seal material 304 is arranged in a grid-like manner, and a liquid crystal region 305 partitioned for each pixel is provided. An indium tin oxide (ITO) electrode 303 is placed on the lower side of the liquid crystal region 305.

The thin film transistor 150 for driving the pixel is placed in the liquid crystal region 305 of each pixel, and liquid crystal is enclosed in the liquid crystal region 305. An ITO electrode 307 which is a common electrode is placed on the upper side of the liquid crystal region 305, and a black matrix 308 and color filter 309 positioned above the thin film transistor 150 are arranged side by side above the ITO electrode 307. Moreover, a color filter substrate 310 is laminated on an upper layer of the black matrix 308 and the color filter 309, and a polarizing plate 311 is placed on an upper layer of the color filter substrate 310, to form the liquid crystal display (TFT-LCD 320).

Embodiment 9

Figure 11:
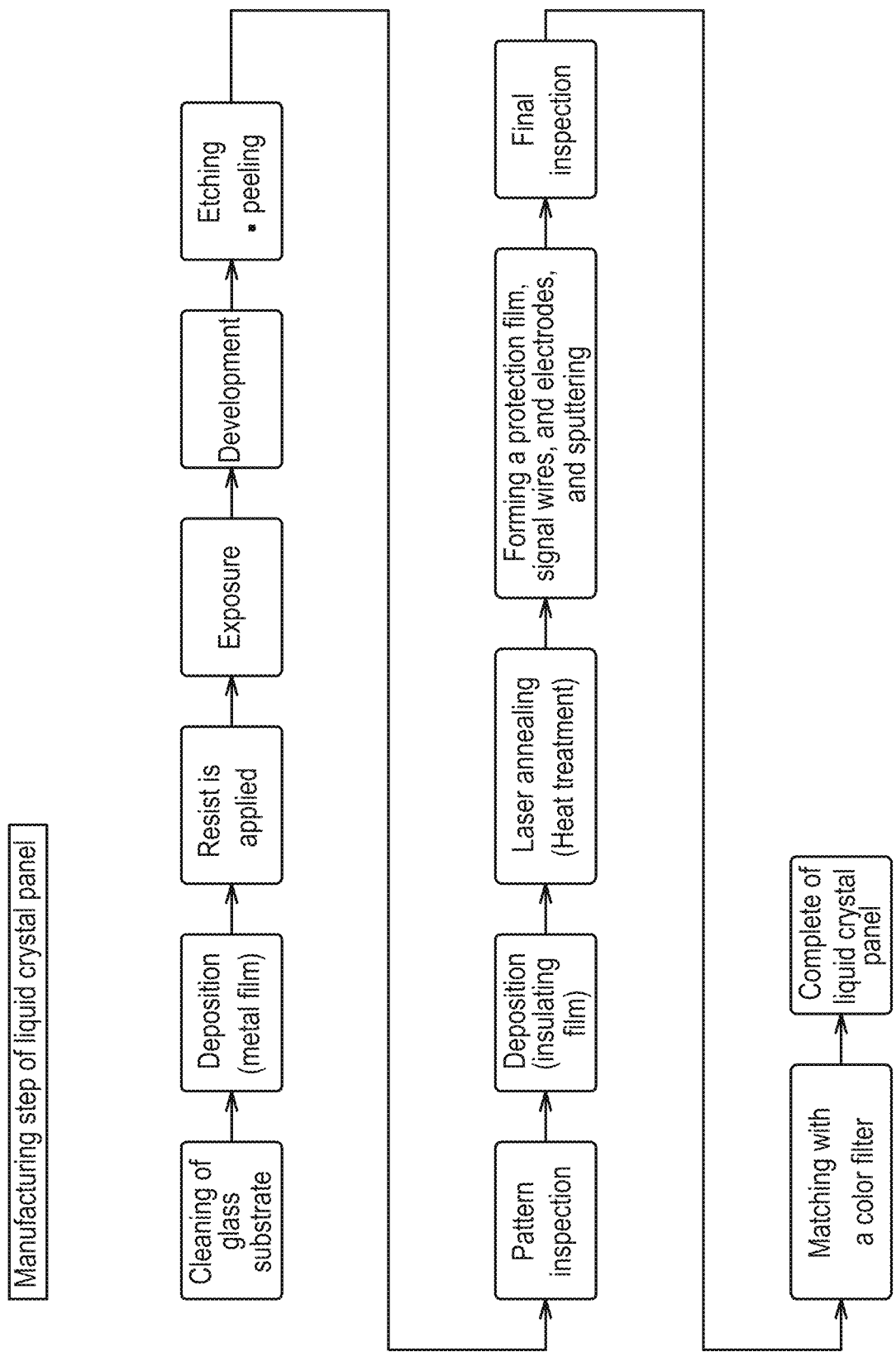
FIG. 11 is a flowchart showing a manufacturing process of liquid crystal display of the present invention.

Next, a manufacturing procedure of the liquid crystal display will be described with reference to a flowchart of FIG. 11.

First, a glass substrate is prepared, and cleaned for the next step. In the next step, a metal film is formed on the glass substrate, a resist is applied on an upper layer of the metal film, and the resist is exposed through a patterned mask to be developed.

Thereafter, patterning is performed by etching and peeling, and a pattern inspection is conducted. Then, an insulating film is deposited on an upper layer of the substrate. The laser annealing treatment of the present invention is performed on the resultant substrate. Furthermore, steps of forming a protection film, signal wires, and electrodes, and sputtering and the like are performed, and a final inspection is conducted. After the final inspection, steps such as matching with a color filter are performed, and the TFT-LCD is completed.

The thin film transistor 150 used in the embodiment is capable of a high-speed switching operation, and can therefore enable high-speed switching of voltages applied to the liquid crystal of each subpixel. Hence, the TFT-LCD of the embodiment enables a high-speed response to the movement of an image.

Note that although the TFT-LCD has been described, the usage example of the thin film transistor 150 is not limited to this, and the invention is also applicable to a display device such as an organic electroluminescence (EL) display.

Example 1

Figure 12:
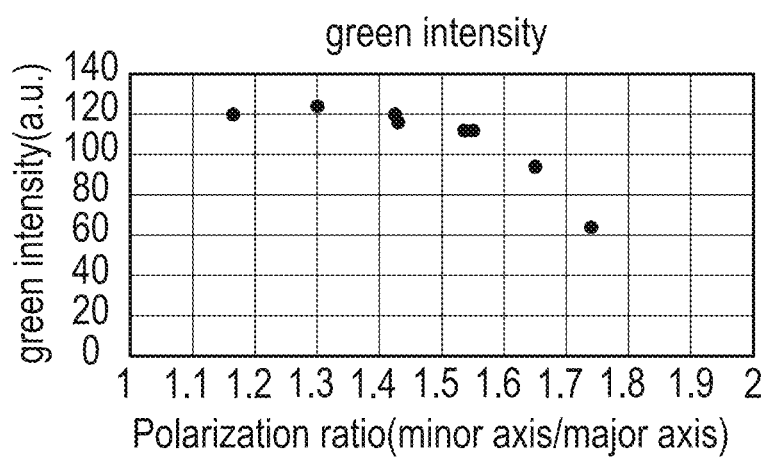
FIG. 12 is a graph showing a relationship between a polarization ratio and green light intensity indicating the periodicity of a crystal in an example.

A damping element was placed as an optical element for changing polarization between a laser light source and an optical system that forms a line beam in a conventional apparatus, and the P-polarized component and the S-polarized component were changed as shown in FIG. 12. By changing the angle of incidence on the damping element, the ratio of p-polarization to s-polarization on the irradiation surface was changed for crystallization of an amorphous silicon film.

In order to investigate the periodicity of crystallization with respect to the obtained crystalline film, the luminance distribution of an image captured by a polarized optical microscope was measured by a dark-field detector. In this example, crystal grain with a high signal luminance was evaluated as a good crystal grain.

The results are shown in FIG. 12. The luminance of the substrate is higher when the polarization ratio is closer to 1, and it has been found that unevenness in the shot was reduced both in the microscope and eye observation.

FIG. 13 shows the measurement results by the microscope. It is clear from FIG. 13 that the luminance of the substrate increases as the polarization ratio is closer to 1.

Although the present invention has been described on the basis of the embodiments, the invention is not limited to the contents of the embodiments, and the embodiments can be modified appropriately, without departing from the scope of the invention.

REFERENCE SIGNS LIST

1 laser processing apparatus
2 laser light source
3 laser beam
4 first beam splitter
5A collimator
5B collimator
6 second beam splitter
7 homogenizer
8 condenser lens
9 third beam splitter
100 substrate
107 gate electrode
108 source region
109 drain region
110 channel region
112 source electrode
113 drain electrode
150 thin film transistor
200 subcell
320 TFT-LCD

The invention claimed is:

1. A laser processing apparatus for irradiating a laser beam output from a laser light source on a workpiece, the laser processing apparatus comprising:
    a laser light source that generates a laser beam;
    a first beam splitter on which the laser beam from the laser light source is incident, and which divides the laser beam incident thereon into a plurality of laser beams that have adjusted ratios of an intensity of a p-polarized light component to an intensity of an s-polarized light component;
    a second beam splitter on which the plurality of laser beams are incident, and which divides each of the laser beams incident thereon into a plurality of laser beams that have adjusted ratios of the intensity of a p-polarized light component to the intensity of an s-polarized light component;
    a third beam splitter on an optical path between the first beam splitter and the second beam splitter; and
    a homogenizer that controls an energy density of the laser beams emitted from the second beam splitter,
    wherein:
    the first beam splitter and the second beam splitter adjust the ratios of the intensity of the p-polarized light component and the intensity of the s-polarized light component of the laser beams such that a polarization ratio of p-polarized light to s-polarized light of a laser beam output from the homogenizer in a same region on the irradiation surface of the workpiece is at least 0.69 and not more than 1.31,
    the laser beams from the first beam splitter are incident on the third beam splitter, and the third beam splitter divides each of the laser beams incident thereon into a plurality of laser beams that have adjusted ratios of the intensity of a p-polarized light component to the intensity of an s-polarized light component, the laser beams emitted from the third beam splitter are incident on the second beam splitter, and the second beam splitter combines split laser beams together.

2. The laser processing apparatus according to claim 1, wherein the polarization ratio on the same region of the irradiation surface of the workpiece is at least 0.74 and not more than 1.23.

3. The laser processing apparatus according to claim 1, comprising a plurality of laser light sources which output laser beams to the first beam splitter.

4. The laser processing apparatus according to claim 3, further comprising, on at least one optical path of the plurality of laser beams, a polarization element that changes a state of polarization of a laser beam on the optical path.

5. The laser processing apparatus according to claim 4, further comprising a polarization measurement section that measures a state of polarization of the laser beam output from the homogenizer.

6. The laser processing apparatus according to claim 5, further comprising a controller that receives a measurement result of the polarization measurement section, and controls the state of polarization of the laser beam on the basis of the measurement result.

7. The laser processing apparatus according to claim 4, wherein the laser light source is an excimer laser light source.

8. The laser processing apparatus according to claim 4, wherein the laser light source is a solid laser light source.

9. The laser processing apparatus according to claim 4, wherein:
the workpiece is an amorphous silicon film; and
the laser processing apparatus is an apparatus for crystallizing the amorphous silicon film.

10. A semiconductor device manufacturing method comprising:
(a) forming amorphous silicon on a substrate;
(b) irradiating a laser beam on the amorphous silicon to form polysilicon;
(c) allowing the laser beam to enter a first beam splitter which divides the laser beam incident thereon into a plurality of laser beams that have adjusted ratios of an intensity of a p-polarized light component to an intensity of an s-polarized light component;
(d) allowing the laser beams emitted from the first beam splitter to enter a third beam splitter which divides each of the laser beams incident thereon into a plurality of laser beams that have adjusted ratios of the intensity of a p-polarized light component to the intensity of an s-polarized light component;
(e) allowing the laser beams emitted from the first third beam splitter to enter a second beam splitter which divides each of the laser beams incident thereon into a plurality of laser beams that have adjusted ratios of the intensity of a p-polarized light component to the intensity of an s-polarized light component; and
(f) allowing the laser beams emitted from the second beam splitter to enter a homogenizer, and controlling an energy density of the laser beams,
wherein in the step (b), the laser beam emitted is from a laser light source through a plurality of beam splitters which adjust a ratio of an intensity of a p-polarized light component and an s-polarized light component such that a polarization ratio of p-polarized light to s-polarized light of the laser beam irradiated in a same region of an irradiation surface of the amorphous silicon is at least 0.69 and not more than 1.31, and
wherein the second beam splitter combines split laser beams together.

11. The semiconductor device manufacturing method according to claim 10, wherein in the step (b), the polarization ratio is at least 0.74 and not more than 1.23.

12. The semiconductor device manufacturing method according to claim 10, wherein the polysilicon is a channel portion of a TFT.

13. The semiconductor device manufacturing method according to claim 12, wherein:
the TFT is used in a liquid crystal display; and
the TFT is used to control a pixel.

14. The semiconductor device manufacturing method according to claim 12, wherein:
the TFT is used in an OLED display; and
the TFT is used to control a pixel.

15. The semiconductor device manufacturing method according to claim 10, wherein the substrate is a glass substrate or a plastic substrate.

16. An amorphous silicon crystallization method comprising:
(a) emitting a laser beam from a laser light source;
(b) allowing the laser beam to enter a first beam splitter which divides the laser beam incident thereon into a plurality of laser beams that have adjusted ratios of an intensity of a p-polarized light component to an intensity of an s-polarized light component;
(c) allowing the laser beams emitted from the first beam splitter to enter a third beam splitter which divides each of the laser beams incident thereon into a plurality of laser beams that have adjusted ratios of the intensity of a p-polarized light component to the intensity of an s-polarized light component;
(d) allowing the laser beams emitted from the third beam splitter to enter a second beam splitter which divides each of the laser beams incident thereon into a plurality of laser beams that have adjusted ratios of the intensity of a p-polarized light component to the intensity of an s-polarized light component;
(e) allowing the laser beams emitted from the second beam splitter to enter a homogenizer, and controlling an energy density of the laser beams; and
(f) irradiating a laser beam emitted from the homogenizer on amorphous silicon and crystallizing the amorphous silicon, wherein a ratio of the intensity of the p-polarized light component to the intensity of the s-polarized light component of the laser beam emitted from the homogenizer on a surface of the amorphous silicon is at least 0.69 and not more than 1.31,
wherein the second beam splitter combines split laser beams together.

17. The amorphous silicon crystallization method according to claim 16, wherein the ratio of the intensity of the p-polarized component to the intensity of the s-polarized component of the laser beam emitted from the homogenizer on the surface of the amorphous silicon is at least 0.74 and not more than 1.23.

18. The amorphous silicon crystallization method according to claim 16, wherein:
at least two of the laser beams are provided; and
each laser beam is alternately or sequentially one by one irradiated on amorphous silicon.

* * * * *